United States Patent
Davis, Jr. et al.

[11] Patent Number: 5,553,013
[45] Date of Patent: Sep. 3, 1996

[54] DELAY GENERATION FILTER

[75] Inventors: Leighton I. Davis, Jr.; Robert W. Matteson, both of Ann Arbor, Mich.

[73] Assignee: Ford Motor Company, Dearborn, Mich.

[21] Appl. No.: 316,012

[22] Filed: Sep. 30, 1994

[51] Int. Cl.$^6$ ................................................. G06F 17/10
[52] U.S. Cl. ............................................. 364/726.17
[58] Field of Search ....................... 364/724.01, 724.03, 364/724.1, 724.17

[56] References Cited

U.S. PATENT DOCUMENTS

| | | | |
|---|---|---|---|
| 4,356,558 | 10/1982 | Owen et al. | 364/724.01 |
| 4,497,035 | 1/1985 | Yabuuchi et al. | 364/577 |
| 4,573,135 | 2/1986 | Dieterich | 364/724.01 X |
| 4,751,663 | 6/1988 | Yamazaki | 364/724.17 |
| 4,760,542 | 7/1988 | Mehrgardt et al. | 364/724.01 |
| 4,811,262 | 3/1989 | White | 364/724.01 |
| 4,866,647 | 9/1989 | Farrow | 364/724.1 |
| 5,245,127 | 9/1993 | Yamauchi et al. | 84/624 |
| 5,301,135 | 4/1994 | Principe et al. | 364/724.17 |
| 5,349,548 | 9/1994 | Nillesen | 364/724.1 |

OTHER PUBLICATIONS

The Gamma Model—A New Neural Model For Temperal Processing, by Dr. Vries, B. and Principle, J. C., *Neural Networks*, vol. 5, pp. 565–576 (1992).

*Primary Examiner*—Roy N. Envall, Jr.
*Assistant Examiner*—Chuong D. Ngo
*Attorney, Agent, or Firm*—Mark L. Mollon; Roger L. May

[57] ABSTRACT

An $N^{th}$ order infinite impulse response digital filter for long-delay filtering of signals representing a digital input sequence. The $N^{th}$ order infinite impulse response digital filter is synthesized by cascading in series N first order infinite impulse response filter stages. A filter stage operable on a digital computer with floating point capability is provided and comprises a multiplier which multiplies an input signal with a weighting factor. A summing element provides an output for the filter stage by summing the weighted input signal with a weighted and delayed output signal. A filter operable on a digital computer with fixed point capability is provided and comprises a summing element which sums an input signal with the output of a first multiplier, and the delayed output of a mask element. The output of the summing element is coupled to the input of a second multiplier and to the input of the mask element. The second multiplier provides an output for the filter stage which is also used, in a delayed form as the input of the first multiplier.

9 Claims, 4 Drawing Sheets

= 5,553,013 =

DELAY GENERATION FILTER

A portion of the disclosure of this patent document contains material which is subject to copyright protection. The copyright owner has no objection to the facsimile reproduction by anyone of the patent documents or the patent disclosure, as it appears in the Patent or Trademark Office patent file or records, but otherwise reserves all copyright rights whatsoever.

FIELD OF THE INVENTION

The present invention relates to the field of signal processing and in particular to filtering of received signals to generate a delayed value of the received signal.

BACKGROUND OF THE INVENTION

In signal processing it is sometimes necessary to utilize a value of a received input signal as it existed at a prior time in order to perform a desired control or information processing function. Digital systems generally sample incoming signals at a very high rate which is on the order of many times a second. In known systems which perform control or information processing functions based on received signals, a large amount of storage is required in digital systems and a large number of delay elements are required in analog systems if the value of the incoming signal as it existed in the past is needed. For example, an electronic automatic temperature controller (EATC) used on an automotive vehicle utilizes a temperature sensor to generate a signal indicative of ambient temperature or use by the EATC. Unless the sensor is placed in a position far removed from the engine compartment, heat generated by the engine, exhaust or other components is likely to affect the temperature detected by the sensor. When the sensor is located in the engine compartment at a position to be exposed to air entering the engine compartment, it has been found to provide an accurate reading when the vehicle is in motion. However, when the vehicle is standing the temperature sensor gives a much higher reading than normal because of the increased air temperature in the engine compartment. In such a circumstance, it is helpful to have the value of temperature as it existed several minutes in the past, such as before the vehicle stopped, so that the EATC can accurately determine the existing ambient temperature. With certain finite impulse response filters, if a five minute delay is desired for a signal sampled every second, a system utilizing a finite impulse response filter of known type would need 300 storage or delay elements. One solution is for the EATC to utilize a vehicle velocity signal which is indicative of vehicle velocity in order to determine when the signal from the temperature sensor should be ignored. However, if the vehicle velocity signal is not already being used by the EATC, then use of such a signal adds to the cost and physical complexity of the EATC. In addition, even if the vehicle velocity signal is available to the EATC, an accurate value of ambient air temperature is still required. If the vehicle is stopped momentarily, then a temperature value indicative of the temperature before the vehicle stopped, will still be required.

Accordingly, there is a need for a filter which generates a delayed value of an input signal without requiring the large number of storage or delay elements required by known systems.

SUMMARY OF THE INVENTION

It is a primary object of the present invention to generate a delayed value of a value of a received input signal without utilizing a large number of storage or delay elements In accordance with the primary object, in one aspect of the invention an input signal is delayed a predetermined amount of time with a first order infinite impulse response (IIR) filter which comprises a summing element which generates an intermediate value as a function of an input value, a first value and a second value. A first multiplier generates an output value as a function of the intermediate value and a first weighting value. The IIR filter also comprises a residual generation element responsive to the summing element for generating a numerical residual value indicative of a difference in resolution between the output value and the intermediate value. A first delay element, which is responsive to the residual generation element delays the numerical residual value by a predetermined amount of time to generate the first value. A second delay element, which is responsive to the first multiplier, delays the output value by the predetermined amount of time to generate a delayed output value, and a second multiplier, which is responsive to the second delay element, generates the second value as a function of the delayed output value and a second weighting value.

In another aspect of the invention, a plurality of filters utilizing the principles of the aforementioned IIR filter are cascaded to generate a substantial time delay.

An advantage of at least certain embodiments is that a delay on the order of several minutes may be generated without utilizing a large number of storage or delay elements.

These and other features and advantages of the present invention may be better understood by considering the following detailed description of preferred embodiments of the invention. In the course of this description, reference will be made to the attached drawings.

DETAILED DESCRIPTION

Figure 1:
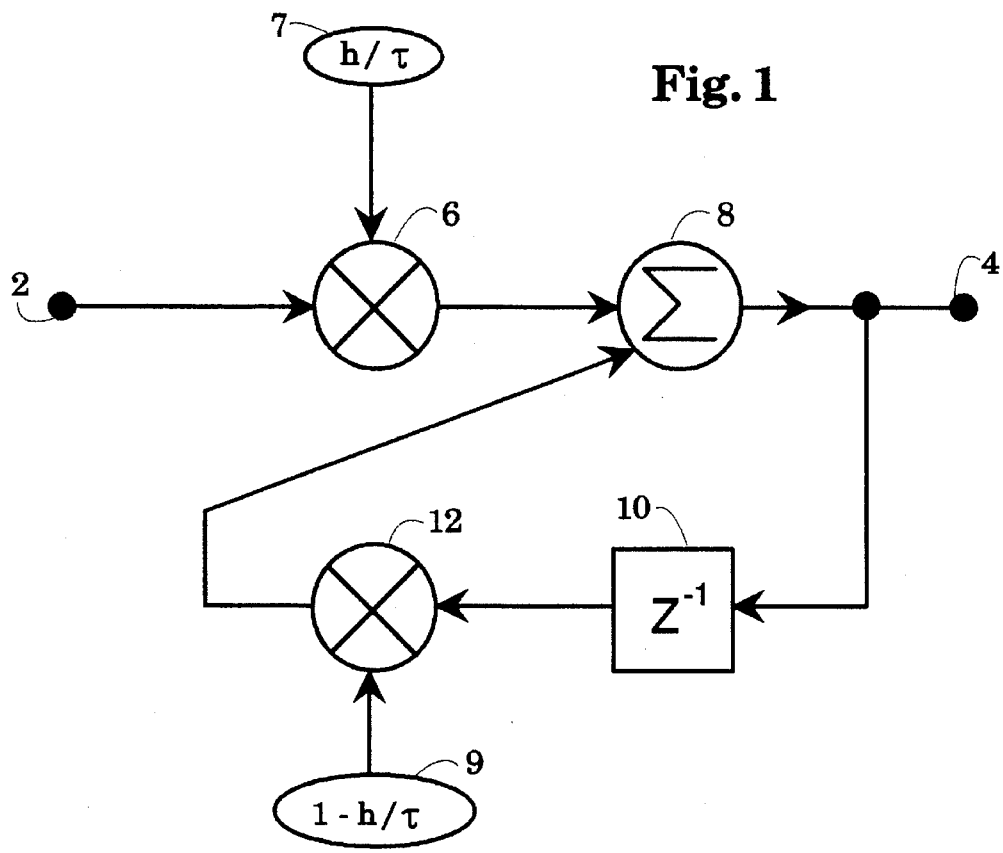
FIG. 1 is a schematic diagram of a first embodiment of a filter stage which embodies the invention.

FIG. 1 shows a block diagram of a single filter stage which is operable on a digital computer which utilizes floating point arithmetic. The filter stage is a first order infinite impulse response (IIR) filter with an input port 2 and an output port 4. The first order IIR has a sample time represented by a variable h, which in a preferred embodiment has a value of one second. Multiplier 6 multiplies an input signal by a weighting factor $h/\tau$, where $\tau$ represents a time constant in seconds. The output from multiplier 6 is coupled to an input of a summing element 8 which provides an output value of the filter stage through output port 4.

Storage element 10 has its input coupled to output port 4 and operates to provide a delayed version of the value existing at output 4, to multiplier 12. Multiplier 12 multiplies the output of storage element 10 by a weighting factor (1 - hτ), and provides the output to summing element 8.

Multipliers 6 and 12, summer 8, and delay element 10 are preferably implemented by a programmable digital computer. Alternatively, the filter stage may be implemented by specialized digital or analog circuits.

A preferred embodiment advantageously creates an $N^{th}$ order infinite impulse response digital filter by cascading in series N stages identical to the stage of FIG. 1. The result is filter 220 of FIG. 2, where the input port to the first stage 221 of filter 220 is coupled to the output port of source 201 and the output port of the last stage 223 of filter 220 is coupled to utilization circuit 240. The input port of any other stage, besides the first and last in FIG. 2, such as stage 222, is coupled to the output port of a preceding stage. The resulting z-transform equation H(z) of filter 220, ignoring any numerical round-off errors, is given by the following relationship:

$$H(z) = \frac{(h/\tau)^N \cdot z^{-N}}{[1 - (1 - h/\tau) z^{-1}]^N}$$

where $z^{-1}$ is a unit time delay, τ represents the time constant of each of the filter stages and N represents the number of filter stages.

Figure 2:
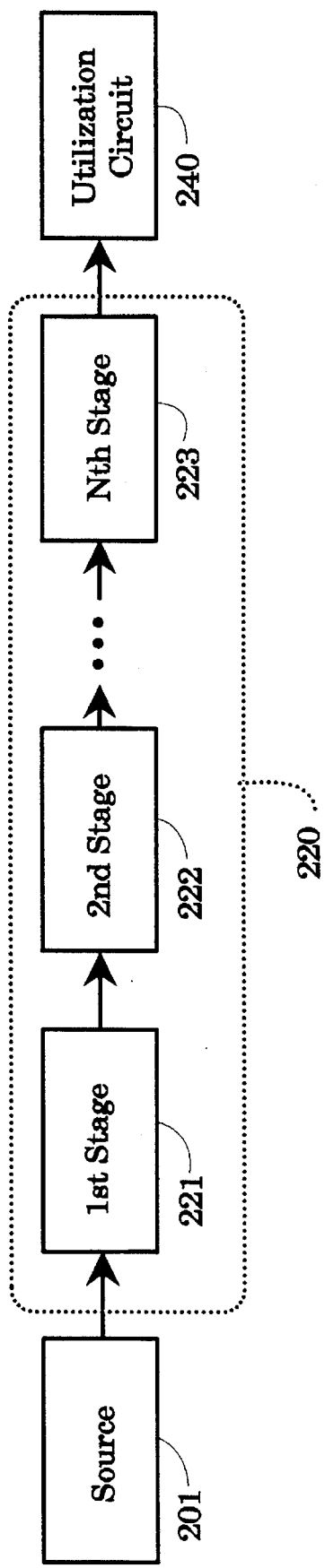
FIG. 2 is a schematic diagram of a plurality of cascaded filter stages.

Each of the filter stages 221, 222 and 223 of FIG. 2 advantageously provides a time delay, with the cascaded delay of all of the filter stages of FIG. 2 generating a substantial time delay without utilizing a large number of delay elements. In FIG. 2 source 201 provides an output in the form of a sequence of digitized signal values. In an alternative embodiment, source 201 may provide an analog continuous-time signal. In such an embodiment if filter 220 is a digital filter, a sample-and-hold circuit and an analog-to-digital converter are required to condition the source signal into a sequence of sampled signal values.

Figure 3:
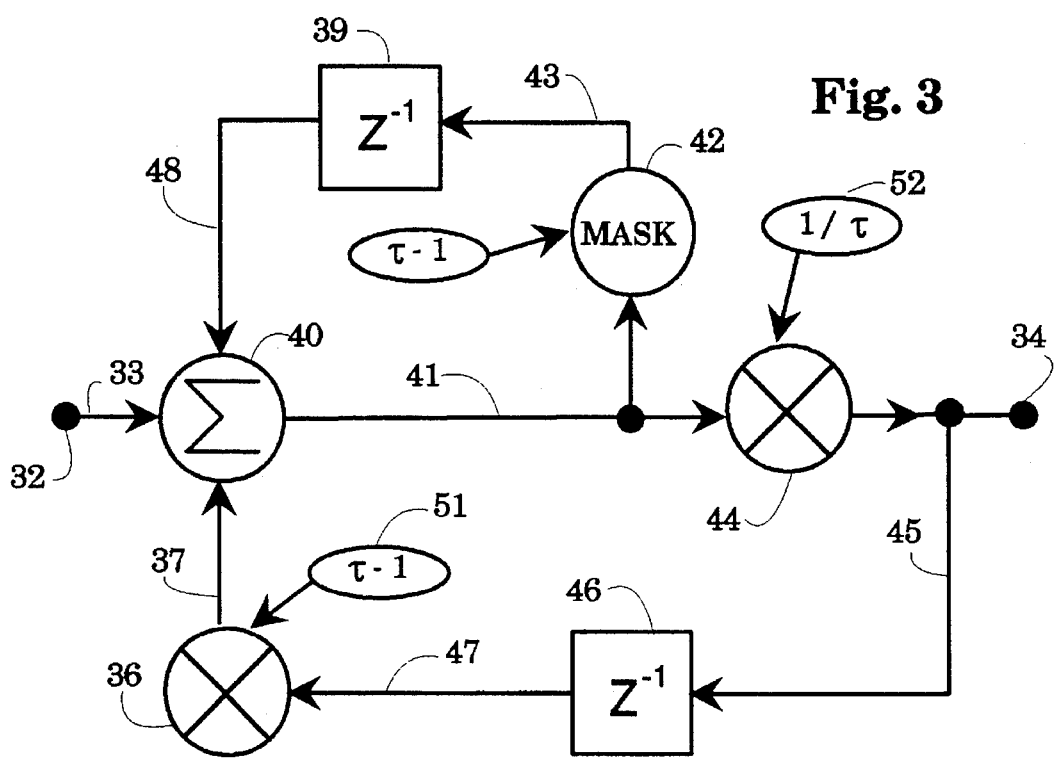
FIG. 3 is a schematic diagram of an alternative embodiment of a filter stage which embodies the invention.

FIG. 3 shows an alternate embodiment, which is preferred for fixed point, or integer, arithmetic. This stage receives an input signal through input port 32 and provides an output through output port 34. Summing element 40 receives input signal 33 from input port 32, and provides an output 41 which is the sum of the value of input signal 33, and signals 37 and 48. Multiplier 44 multiplies signal 41 with a weighting factor 1/τ to generate output signal 45. As used in the fixed point filter shown in FIG. 3, τ is a time constant in terms of the sample period. Storage element 46 receives output signal 45 and generates signal 47 which is a delayed version of output signal 45. Multiplier 36 multiplies signal 47 with a weighting factor τ-1 to generate signal 37. The operations performed by elements 42 and 39 advantageously perform a resolution enhancement function which improves the accuracy of the filter stage. Masking element 42 masks signal 41 with a mask value τ-1 to generate signal 43 which is delayed by storage element 39 to generate signal 41. As will be appreciated by those skilled in the art in view of the present disclosure, the masking element generates a numerical residual value which is indicative of the difference in resolution between the value at 34 and the value at 41. Values 41, 43 and 48 are preferably generated using double-precision storage locations to provide enhanced resolution. The residual generation function is preferably performed by a masking element such as seen in FIG. 3. In an alternative embodiment, the residual generation function is performed by a modulo operation using a modulo value of τ, where τ=$2^m$, m is an integer which represents a value selected to achieve a desired delay with a desired number of filter stages.

The filter stage seen in FIG. 3 is preferably implemented with a digital computer executing a stored program. As will be appreciated by those skilled in the art in view of the present disclosure, the filter stage of FIG. 3 may be implemented with digital circuitry which comprise either discrete components or are integrated onto a single integrated circuit. As will be appreciated by those skilled in the art in view of the present disclosure, multipliers 36 and 44 involve simple bit shifts and subtraction and can be implemented with relatively few program steps or logic elements and shift registers. Summing element 40 and delay elements 39 and 46 may also be implemented with logic elements and shift registers.

An $N^{th}$ order filter for fixed point, or integer, arithmetic is synthesized by cascading in series N stages identical to the stage of FIG. 3 to generate a series of delay stages as seen in FIG. 2 and described above.

Figure 4:
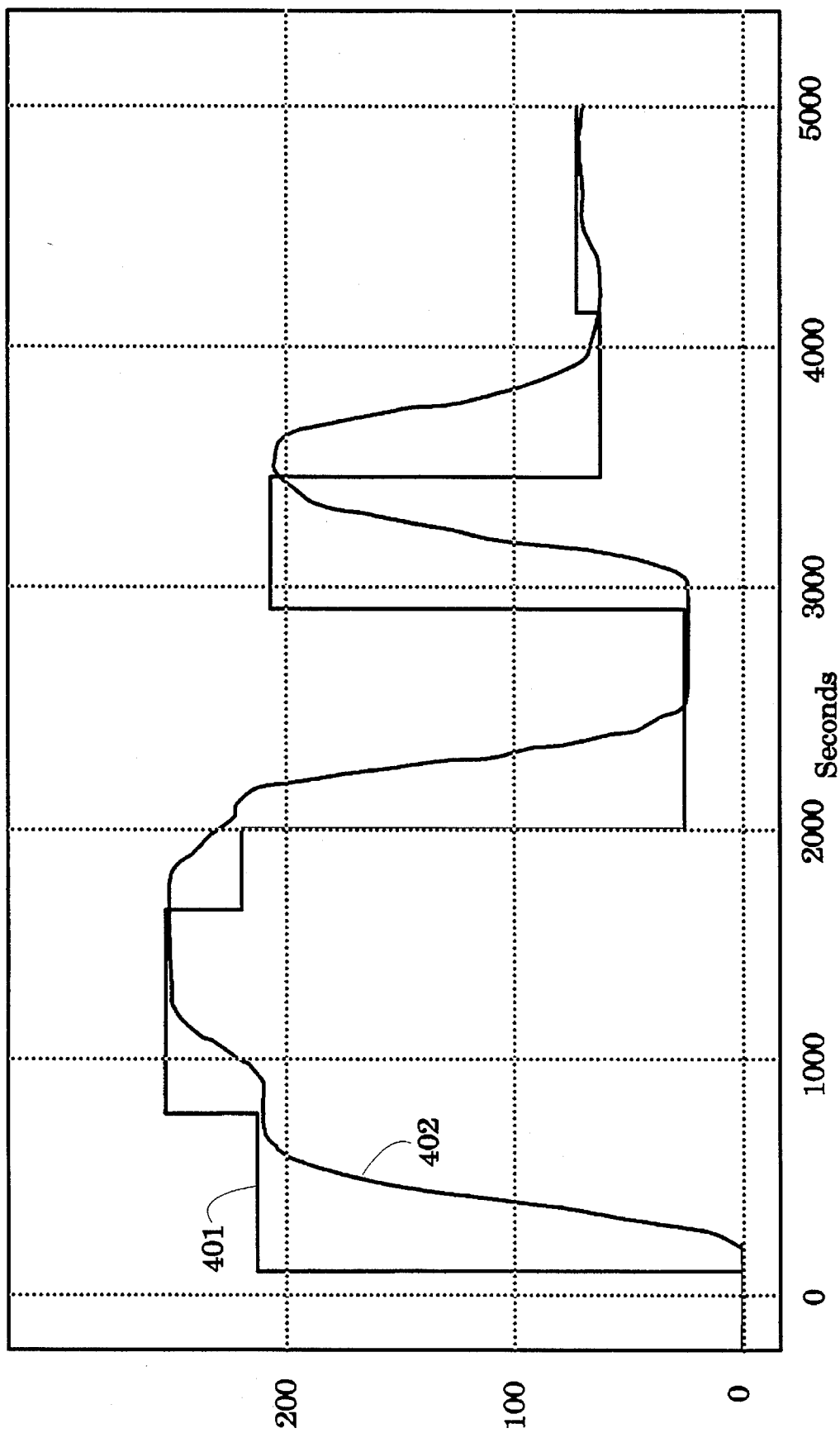
FIG. 4(a) is a graph showing the response of a preferred embodiment to an input signal.

FIG. 4 of the drawings shows an input 401 to filter 220 with a corresponding output at 402 of filter 220. Each of the stages of filter 220 may be of the type shown in FIG. 1 or FIG. 3. In FIG. 4, ten filter stages are used with the value τ for each filter having a value of 32. For the floating point filter in FIG. 4, h preferably has a value of one second. As can be seen in FIG. 4, the cascaded stages of filter 220 delay and smooth the output of source 201. It is understood that line 402 represents an output of a cascaded filter utilizing filters of the type shown either in FIG. 1 or FIG. 3. The delay time can be significant and is approximately given by the product Nτh, where h is the sampling rate. The approximation improves as N increases. In order to provide a delay of Nτh time shifts, filter 220 advantageously requires only N delay or storage elements, whereas a finite impulse response filter would require [Nτ] delay or storage elements.

Figure 5:
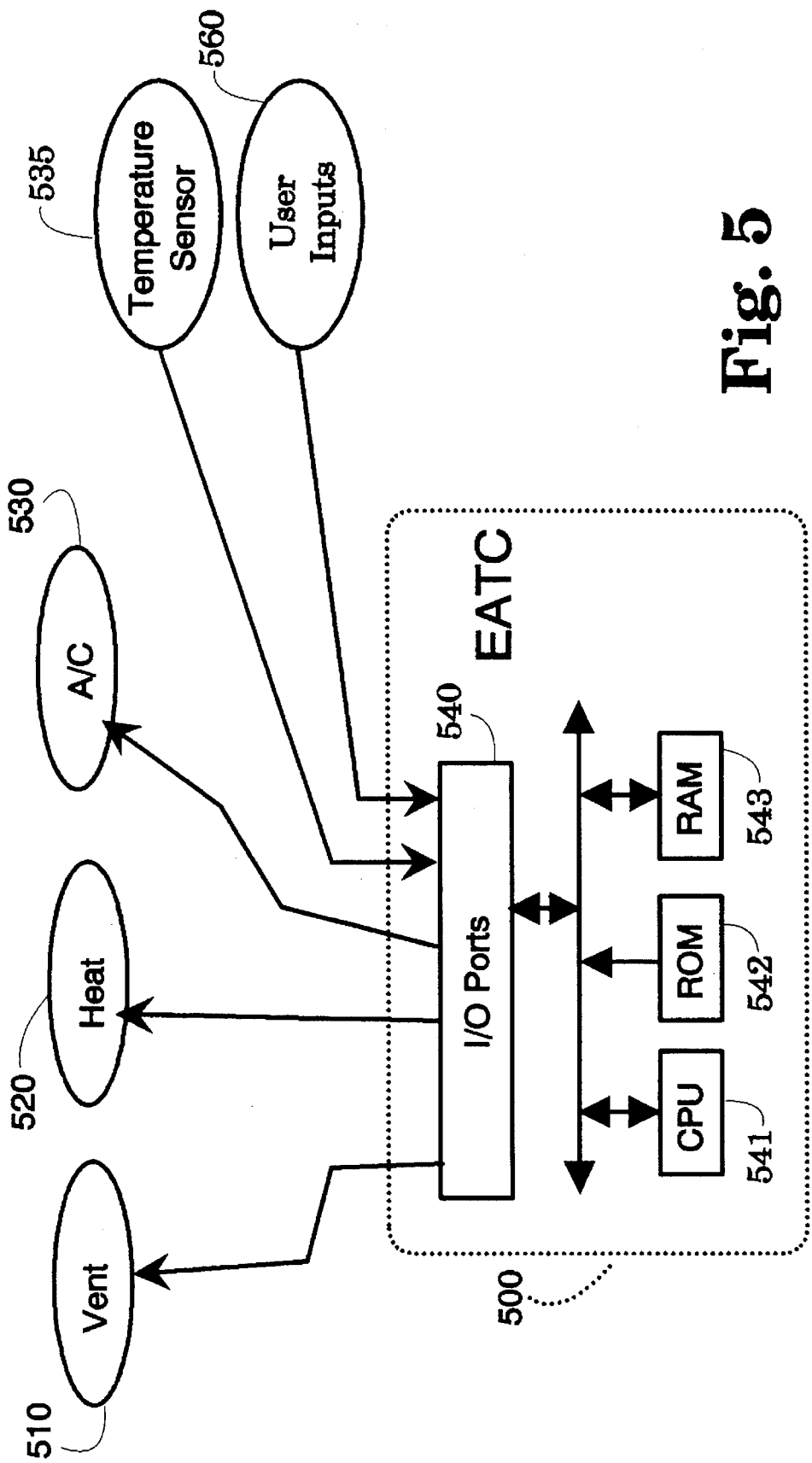
FIG. 5 is a schematic diagram of an electronic automatic temperature controller utilizing the principles of the present invention.

FIG. 5 of the drawings shows an Electronic Automatic Temperature Controller (EATC) installed in a vehicle which utilizes the principles of the present invention. In FIG. 5, EATC 500 receives a temperature signal from temperature sensor 535. Temperature sensor 535 is of known type and is positioned in the engine compartment to be directly exposed to air as it enters the engine compartment while the vehicle is in motion. EATC 500 responds to signals from temperature sensor 535 and from user inputs entered at 560 to generate control signals for changing the temperature and volume of air entering the interior compartment of the vehicle. In a preferred embodiment, the interior compartment is a passenger compartment. In alternative embodiments, the interior compartment may be a storage compartment which may be a refrigerated compartment or other type of compartment kept within a predefined temperature range. As can be seen in FIG. 5, control signals from EATC 500 control the operation of a plurality of temperature alteration systems which take the form of ventilation 510, heating 520 and air conditioning 530 units of the vehicle.

EATC 500 preferably comprises a microcomputer including a central processor unit (CPU) 541, input and output (I/O) port 540, read only memory (ROM) 542 for storing control programs, random access memory (RAM) 543, for temporary data storage which may also be used for counters or timers, and a conventional data bus. EATC 500 operates under stored program control to receive input signals, and to generate output signals to perform the above described control functions.

As previously indicated, in a preferred embodiment, the present invention is advantageously implemented by means of a microprocessor and memory containing suitable programs and data structures for providing the desired control functions. The following C language program listing illustrates to those skilled in the art, an implementation of a preferred embodiment.

systems which take the form of ventilation 510, heating 520 and air conditioning 530 units of the vehicle.

EATC 500 preferably comprises a microcomputer including a central processor unit (CPU) 541, input and output (I/O) port 540, read only memory (ROM) 542 for storing control programs, random access memory (RAM) 543, for temporary data storage which may also be used for counters or timers, and a conventional data bus. EATC 500 operates under stored program control to receive input signals, and to generate output signals to perform the above described control functions.

As previously indicated, in a preferred embodiment, the present invention is advantageously implemented by means of a microprocessor and memory containing suitable programs and data structures for providing the desired control functions. The following C language program listing illustrates to those skilled in the art, an implementation of a preferred embodiment.

```
        #define  E    2.718281828

/* Function prototypes: */
        /* float  camel (double, double, double, int, int, int) ;   */
        /* float  icamel (int, int, int, int, int, int) ;    */

5       /* globals: */ float  camel (sys_in, tint, tau, order, init_flag, details)
        double  sys_in, tint, tau ;
        int  order, init_flag, details ;
        {   /* tint: sample time interval, tau: time constant, (n-th) order filter  */
10         /*  -- This is a series-cascaded (order times) single pole filter.  */
            int  i, j ;
          static  int  first_time = 1 ;
          static  int  noa_wts, nob_wts ;
          static  float  * casc_in, * a_wts, * casc_out, * b_wts ;
15        static  float  s_out ;
          static  float  alpha, beta ;

/* Initialization: */
             if (first_time) {
               if (details > 1) fprintf (stderr," -- starting up camel --\n") ;
20             alpha  =  tint / tau ;
               beta  =  1.0 - alpha ;
               /* Forward weights: */
             noa_wts =  order + 1 ;          /* no. of cascade sections */
             if (details > 3) fprintf (stderr," -- allocating casc_in & a_wts --\n") ;
25           casc_in  =  (float *) calloc (noa_wts, sizeof(float)) ;
             a_wts    =  (float *) calloc (noa_wts, sizeof(float)) ;
             if (details > 3) fprintf (stderr," -- order = %d --\n", order) ;
             if (details > 3) fprintf (stderr,"  a_wts @%p \n", a_wts) ;
             for (i=0; i < noa_wts ; i++) {
30              casc_in[i] =  0.0 ;
                /* coupling between sections: */
                /* a_wts[i]  =  alpha * gamman ;      - for unity pulse response */
                a_wts[i]  =  alpha ;            /* for unity step  response */
                if (details > 3)
35                fprintf (stderr,"  a_wts[%d] = %7.3f\n", i, a_wts[i]) ;
             }
             /* Recurrent weights: */
             if (details > 3) fprintf (stderr," -- allocating casc_out & b_wts --\n") ;
             nob_wts =  order + 1 ;   /* addl. for offset (not used)  */
```

```
        casc_out = (float *) calloc (nob_wts, sizeof(float)) ;
        b_wts   = (float *) calloc (nob_wts, sizeof(float)) ;
        b_wts[0] = 0.0 ;        /* - not used - */
        casc_out[0] = 0.0 ;
        for (j=1; j < nob_wts ; j++) {
           casc_out[j] = 0.0 ;
           b_wts[j] = beta ;
        }
        first_time = 0 ;
        if (details > 1) {
           fprintf (stderr," --- %dth order weights initialized: ---\n",
                                            order) ;
           fprintf (stderr,"  a_wts @%p \n", a_wts) ;
           fprintf (stderr,"  b_wts @%p \n", b_wts) ;
           for (i=0; i < noa_wts ; i++) {
              fprintf (stderr,"  a_wts[%d] = %7.4f\n", i, a_wts[i]) ;
           }
           for (j=0; j < nob_wts ; j++) {
              fprintf (stderr,"  b_wts[%d] = %7.4f\n", j, b_wts[j]) ;
           }
        }
     }
     if (init_flag) {
        if (details > 0) fprintf (stderr," -- (re-)initializing ccamel --\n") ;
        for (i=0; i < noa_wts ; i++) {
           casc_in[i] = 0.0 ;
        }
        for (j=0; j < nob_wts ; j++) {
           casc_out[j] = 0.0 ;
        }
     }
     /* Starts here: (above is mostly overhead ) ************** */
     casc_in[0] = sys_in ;
     for (i=1; i < noa_wts ; i++) {
        casc_in[i] = b_wts[i]*casc_out[i] + a_wts[i-1]*casc_in[i-1] ;
        casc_out[i] = casc_in[i] ;
     }
     s_out = casc_out[order] ;

if (details > 4) {
        fprintf (stderr," -- Input Cascade: ") ;
        for (i=0; i < noa_wts ; i++) {
           fprintf (stderr," %8.4f", casc_in[i]) ;
        }
```

```
            fprintf (stderr,"\n") ;
          }
          if (details > 4) {
            fprintf (stderr," -- Output Cascade: ") ;
            for (j=0; j < nob_wts ; j++) {
              fprintf (stderr," %8.4f", casc_out[j]) ;
            }
            fprintf (stderr,"\n") ;
          } return (s_out) ;
        } int  icamel (sys_in, tau, order, accumulate, init_flag, details)
        int  sys_in, tau, order, accumulate, init_flag, details ;
        {  /* tint: not used, tau: time constant in steps, (n-th) order filter */
           /*   -- This is a series-cascaded (order times) single pole filter. */
              int  i, j ;
           static  int  first_time = 1 ;
           static  int  noa_wts, nob_wts ;
           static  int  * casc_in, * a_wts, * casc_out, * b_wts, * accum ;
           static  int  s_out ;
           static  int  alpha, beta ;

/* Initialization: */
           if (first_time) {
             if (details > 1)  fprintf (stderr," -- starting up icamel --\n") ;
             alpha = 1 ;
             beta  = tau - 1 ;
             /* Forward weights: */
             noa_wts = order + 1 ;           /* no. of cascade sections */
             if (details > 3)  fprintf (stderr," -- allocating casc_in & a_wts --\n") ;
             casc_in = (int *) calloc (noa_wts, sizeof(int)) ;
             a_wts   = (int *) calloc (noa_wts, sizeof(int)) ;
             if (details > 3) {
               fprintf (stderr," -- order = %d --\n", order) ;
               fprintf (stderr,"  a_wts @%p :\n", a_wts) ;
             }
             for (i=0; i < noa_wts ; i++) {
               casc_in[i] = 0 ;
               /* coupling between sections: */
               a_wts[i] = alpha ;            /* for unity step response */
             }
             /* Recurrent weights: */
```

```
        if (details > 3) fprintf (stderr," -- allocating casc_out & b_wts --\n") ;
        nob_wts = order + 1 ;    /* addl. for offset (not used) */
        casc_out = (int *) calloc (nob_wts, sizeof(int)) ;
        accum    = (int *) calloc (nob_wts, sizeof(int)) ;
  5     b_wts    = (int *) calloc (nob_wts, sizeof(int)) ;
        b_wts[0] = 0 ;      /* - not used - */
        casc_out[0] = 0 ;
        for (j=1; j < nob_wts ; j++) {
           casc_out[j] = 0 ;
 10        accum[j]    = 0 ;
           b_wts[j]    = beta ;
        }
        first_time = 0 ;
        if (details > 1) {
 15        fprintf (stderr," --- %dth order weights initialized: ---\n",
                                        order) ;
           fprintf (stderr,"  a_wts @%p :\n", a_wts) ;
           for (i=0; i < noa_wts ; i++) {
              fprintf (stderr,"   a_wts[%d] = %4d\n", i, a_wts[i]) ;
 20        }
           fprintf (stderr,"  b_wts @%p :\n", b_wts) ;
           for (j=0; j < nob_wts ; j++) {
              fprintf (stderr,"   b_wts[%d] = %4d\n", j, b_wts[j]) ;
           }
 25     }
     }
     if (init_flag) {
        if (details > 0) fprintf (stderr," -- (re-)initializing icamel --\n") ;
        for (i=0; i < noa_wts ; i++) {
 30        casc_in[i] = 0 ;
        }
        for (j=0; j < nob_wts ; j++) {
           casc_out[j] = 0 ;
        }
 35  }
     /* Starts here: (above is mostly overhead) ************* */
     casc_in[0] = sys_in ;
     for (i=1; i < noa_wts  ; i++) {
        accum[i]   += b_wts[i]*casc_out[i] + a_wts[i-1]*casc_in[i-1] ;
 40     casc_out[i] = accum[i] / tau ;
        if (accumulate) accum[i] = accum[i] % tau ;
        else            accum[i] = 0 ;
        casc_in[i] = casc_out[i] ;
     }
```

```
        s_out = casc_out[order] ;

if (details > 4) {
        fprintf (stderr," -- Input Cascade: ") ;
        for (i=0; i < noa_wts ; i++) {
            fprintf (stderr," %4d", casc_in[i]) ;
        }
        fprintf (stderr,"\n") ;
        fprintf (stderr," -- Accumulator: ") ;
        for (j=0; j < nob_wts ; j++) {
            fprintf (stderr," %4d", accum[j]) ;
        }
        fprintf (stderr,"\n") ;
        fprintf (stderr," -- Output Cascade: ") ;
        for (j=0; j < nob_wts ; j++) {
            fprintf (stderr," %4d", casc_out[j]) ;
        }
        fprintf (stderr,"\n") ;
    } return (s_out) ;
}
```

As can be seen by those skilled in the art, the above program implements a method for generating an output value which is delayed for a predetermined length of time from a received time varying input signal by first generating an input value corresponding to the received input signal. Second, the input value is multiplied with a first weighting value to generate a first intermediate value. Third, the first intermediate value is added to a third intermediate value to generate an intermediate output value. Fourth, the input value is replaced with the intermediate output value to generate an input value for a subsequent delay stage. Fifth, the intermediate output value is stored to a storage location, for use in the subsequent delay stage. Sixth, the third intermediate value is generated by retrieving the stored intermediate output As can be seen by those skilled in the art, the above program implements a method for generating an output value which is delayed for a predetermined length of time from a received time varying input signal by first generating an input value corresponding to the received input signal. Second, the input value is multiplied with a first weighting value to generate a first intermediate value. Third, the first intermediate value is added to a third intermediate value to generate an intermediate output value. Fourth, the input value is replaced with the intermediate output value to generate an input value for a subsequent delay stage. Fifth, the intermediate output value is stored to a storage location, for use in the subsequent delay stage. Sixth, the third intermediate value is generated by retrieving the stored intermediate output value from the storage location and multiplying the intermediate output value with a second weighting value. In a preferred embodiment, the storage location containing the intermediate output value is initialized with a predetermined value. Seventh, a different storage location for storage of a subsequent intermediate output value is selected. This different storage location will be used as the storage location by the subsequent delay stage to store the intermediate output value. Eighth, the output value is generated by periodically repeating steps two through seven a predetermined number of times, to execute a predetermined number of delay stages. As can be seen from the above description, such an embodiment utilizes a limited number of storage locations while generating an output value which is delayed a substantial amount of time from the input value.

It is to be understood that the specific mechanisms and techniques which have been described are merely illustrative of one application of the principles of the invention. Numerous modifications may be made to the methods and apparatus described without departing from the true spirit and scope of the invention.

What is claimed is:

1. A first order infinite impulse response filter, for generating an output value time delayed from a time-varying input value, comprising:

a summing element responsive to said input value and to a first value and a second value for generating an intermediate value;

a first multiplier responsive to said summing element for generating an output value, time delayed from said input value, as a function of said intermediate value and a first weighting value, which is related to said time delay between said input value and said output value;

a residual generation element responsive to said summing element and to a resolution enhancement value, related to said first weighting value, for generating a numerical residual value indicative of a difference in resolution between said output value and said intermediate value;

a first delay element, responsive to said residual generation element for delaying said numerical residual value by a predetermined amount of time to generate said first value;

a second delay element, responsive to said first multiplier, for delaying said output value by said predetermined amount of time to generate a delayed output value; and a second multiplier, responsive to said second delay element, for generating said second value as a function of said delayed output value and a second weighting value, which is related to said time delay between said input value and said output value.

2. The filter as set forth in claim 1 wherein the residual generation element is a masking element which masks said intermediate value in accordance with a mask value which corresponds to said resolution enhancement value to generate said numerical residual value.

3. The filter as set forth in claim 2 wherein the input value and the output value are each digitally expressed values.

4. The filter as set forth in claim 3 wherein the filter is characterized by a time constant $\tau$, and said first weighting value has a value of h/$\tau$ where h is a constant, said masking value has a value of $\tau$-1 and said second weighting value has a value of $\tau$-1.

5. The filter as set forth in claim 4 wherein the filter is cascaded with a plurality of subsequent filters, each of said subsequent filters being substantially identical to said filter, and wherein the input value of each of said subsequent filters is supplied by the output value of a prior filter.

6. The filter as set forth in claim 5 wherein the time varying input value is indicative of a time varying temperature signal generated by a temperature signal which is installed in a vehicle, and wherein said filters are implemented by an electronic temperature controller which automatically controls the temperature in an interior compartment of said vehicle in response to said time varying temperature signal by changing the temperature and volume of air entering said interior compartment.

7. The filter as set forth in claim 5 wherein each of said filters is implemented by a digital computer which generates said time varying input value as a function of a time-varying signal and utilizes said output value to perform a temperature control function.

8. The filter as set forth in claim 1 wherein the residual generation element is a modulo element which generates said numerical residual value by performing a modulo function on said intermediate value in accordance with a modulo value which corresponds to said resolution enhancement value.

9. An article of manufacture comprising:

a computer storage medium having a computer program encoded therein for causing a computer to control temperature in an interior compartment of a vehicle by producing an output value which is time delayed from a time varying input value, said computer storage medium comprising, summing means responsive to said input value and to a first value and a second value for causing the computer to generate an intermediate value;

first multiplier means responsive to said summing means for causing the computer to generate said output value, time delayed from said input value, as a function of said intermediate value and a first weighting value, which is related to said time delay between said input value and said output value;

residual generation means responsive to said summing means, and to a resolution enhancement value, related to said first weighting value, for causing the computer to generate a numerical residual value indicative of a difference in resolution between said output value and said intermediate value;

first delay means, responsive to said residual generation means for causing the computer to delay said numerical residual value by a predetermined amount of time to generate said first value;

second delay means, responsive to said first multiplier means for causing the computer to delay said output value by said predetermined amount of time to generate a delayed output value; and second multiplier means, responsive to said second delay means, for causing the computer to generate said second value as a function of said delayed output value and a second weighting value, which is related to said time delay between said input value and said output value.

* * * * *